United States Patent
Tsai et al.

(10) Patent No.: US 8,085,613 B2
(45) Date of Patent: Dec. 27, 2011

(54) POWER DETECTING CIRCUIT, PORTABLE DEVICE AND METHOD FOR PREVENTING DATA LOSS

(75) Inventors: Ming-Hung Tsai, Kaohsiung County (TW); Lee Hsin Chou, Hsinchu County (TW)

(73) Assignee: Generalplus Technology Inc., Hsinchu (TW)

( * ) Notice: Subject to any disclaimer, the term of this patent is extended or adjusted under 35 U.S.C. 154(b) by 157 days.

(21) Appl. No.: 12/729,661

(22) Filed: Mar. 23, 2010

(65) Prior Publication Data

US 2010/0309743 A1    Dec. 9, 2010

(30) Foreign Application Priority Data

Jun. 3, 2009  (TW) .................... 98118310 A

(51) Int. Cl.
*G11C 5/14*    (2006.01)
(52) U.S. Cl. .................... 365/228; 365/189.05
(58) Field of Classification Search .................. 365/228, 365/189.05
See application file for complete search history.

(56) References Cited

U.S. PATENT DOCUMENTS 7,245,547 B2 * 7/2007 Kim et al. .................... 365/226

* cited by examiner

*Primary Examiner* — Son Dinh
*Assistant Examiner* — Nam Nguyen
(74) *Attorney, Agent, or Firm* — Muncy, Geissler, Olds & Lowe, PLLC

(57) ABSTRACT

In step S508, it is determined whether or not a power low signal SRC_LOSS outputted from the data latch is change. Generally Speaking, the power low signal SRC_LOSS outputted from the data latch would be changed according to the state of the power voltage of the power input terminal. When the power voltage of the power input terminal is charged/discharged to the common voltage, the power low signal SRC_LOSS outputted from the data latch may be changed from the logical high voltage to the logical low voltage or from the original logical low voltage to the logical high voltage. Since the mention above is design of selectiveness, the detailed description is omitted. When the determination is positive, the step S509 is performed. When the determination is negative, the step S511 is performed to re-detect.

13 Claims, 5 Drawing Sheets

POWER DETECTING CIRCUIT, PORTABLE DEVICE AND METHOD FOR PREVENTING DATA LOSS

This application claims priority of No. 098118310 filed in Taiwan R.O.C. on Jun. 3, 2009 under 35 USC 119, the entire content of which is hereby incorporated by reference.

BACKGROUND OF THE INVENTION

1. Field of the Invention

The present invention relates to a circuit for battery power detecting, and more particularly to a power detecting circuit, a portable device and a method for preventing data loss.

2. Related Art

With the progress of the technology, the electronic technology has been progressed from the earliest vacuum tube and transistor to the integrated circuit chip, which has the quite wide applications. Thus, the electronic products have gradually become the indispensable essentials in the life of the modern human beings. Many articles are gradually electrionicized. The purpose of electrionization is for convenience by users. Whether a power source exists or not determines whether the whole system can be properly worked. Especially a portable device uses a battery to be a power source.

In conventional portable device, low-voltage detection is usually utilized to determine whether the power source is removed or not. When the power source is restored, POR (power on reset) is performed to restart the system. Generally speaking, a low-voltage detection circuit with constant power consumption is required so that the system can be maintained in preparation to restart when the power voltage is lower than the operating voltage.

FIG. 1 is a circuit diagram depicting a low-voltage detection circuit in the prior art. Referring to FIG. 1, the low-voltage detection circuit includes a comparator 101, a switch circuit 102, resistors R101, R102 and a reference voltage generating circuit 103. In order to conveniently describe, the circuit diagram further depicts an internal circuit 104, a power input terminal 105 and a capacitor C101. The switch circuit 102 is coupled between the internal circuit 104 and the power input terminal 105. The internal circuit 104 receives an external power supply voltage VSRC through the switch circuit 102. Generally speaking, the switch circuit 102 can be implemented by a P-type transistor. The reference voltage generating circuit 103 is used for generating a reference voltage VREF, wherein the circuit 103 can be implemented by a Bandgap voltage reference circuit to generate a reference voltage of low temperature drift and low power supply drift. The resistors R101 and R102 are used for dividing the external power supply voltage VSRC to generate a dividing voltage VDIV. The positive terminal of the comparator 101 receives the reference voltage VREF, and the negative terminal of the comparator 101 receives the dividing voltage VDIV. Particularly, the power supplies of the reference voltage generating circuit 103 and the comparator 101 are using an internal power supply voltage VKEEP rather than the external power supply voltage VSRC inputted from the power input terminal.

When battery power is consumed with its service time, the external power supply voltage VSRC is also reduced. When the external power supply voltage VSRC is decreased to a specific voltage, it represents that the battery is in very low capacity. If the battery is kept on being used, the external power supply voltage VSRC supplied from the battery will be rapidly reduced. At this time, the dividing voltage VDIV received by the negative terminal of the comparator 101 will be lower than the reference voltage VREF so that the voltage of the comparing signal CP outputted from the output terminal of the comparator 101 is changed from a negative saturation voltage to a positive saturation voltage. The switch circuit 102 is instantly shut off. Meanwhile, the unnecessary function block in the internal circuit 104 is shut off according to the comparing signal CP. In this time, an end user can replace the battery by a new battery.

With regard to most of system, the low-voltage detection circuit may not incur issue. However, some application, such as a universal remote control, still uses the static random access memory (SRAM) to be a storage element for storing the present status. When the battery is in very low capacity, even though the remote control function is shut off, the battery power is constantly consumed by the low-voltage detection circuit. Thus, the charge storing in the capacitor C101 can not be maintained for long to result in no enough time to replace the battery so that the data stored in the SRAM would be lost. Finally, when a new battery is reloaded, the user needs to redefine the universal remote control so as to induce the inconvenience.

SUMMARY OF THE INVENTION

In view of this, it is therefore an objective of the present invention to provide a power detecting circuit adapted for a portable device, wherein extreme low static power consumption can be achieved by the power detecting circuit so that the time for changing battery can be extended.

Another object of the present invention is to provide a portable device. When the battery is in very low capacity, a basic power supply can be provided.

The other object of the present invention is to provide a method for preventing data loss so that the data storing in the static random access memory is kept for a long time when the battery is removed.

To achieve the above-identified or other objectives, the present invention provide a power detecting circuit adapted for a portable device, wherein the portable device includes a power input terminal. The power detecting circuit includes a data latch, a discharge unit and a switch circuit. The data latch is coupled to the power input terminal for receiving a voltage inputted from the power input terminal. The discharge unit includes a first terminal, a second terminal and a control terminal, the first terminal thereof is coupled to the power input terminal, the second terminal thereof is coupled to a common voltage, and the control terminal thereof receives a power detecting signal. When the power detecting signal is enabled, the first terminal of the discharge unit is electrically connected to the second terminal of the discharge unit. The switch circuit includes a first terminal, a second terminal, a first control terminal and a second control terminal, the first terminal thereof is coupled to the power input terminal, the first control terminal thereof is coupled to the data latch, the second control terminal receives the power detecting signal. During a detecting period, the power detecting signal is enabled, the first terminal and the second terminal of the switch circuit is disconnected. If a power low signal outputted from the data latch and received by the first control terminal of the switch circuit is altered from a first state to the second state during the detecting period, the circuit between the first terminal and the second terminal of the switch circuit is kept disconnecting.

In addition, the present invention provides a portable device. The portable device includes a power input terminal, a function block, a random access memory, a microprocessor and a power detecting circuit, wherein the microprocessor is coupled to the random access memory and the function block for controlling the operation of the random access memory and the function block. The power detecting circuit includes a data latch, a discharge unit and a switch circuit. The data latch is coupled to the power input terminal for receiving a voltage inputted from the power input terminal. The discharge unit includes a first terminal, a second terminal and a control terminal, wherein the first terminal thereof is coupled to the power input terminal, the second terminal thereof is coupled to a common voltage, the control terminal thereof receives a power detecting signal. When the power detecting signal is enabled, the first terminal of the discharge unit is electrically connected to the second terminal of the discharge unit. The switch circuit includes a first terminal, a second terminal, a first control terminal and a second control terminal. The first terminal of the switch circuit is coupled to the power input terminal. The first control terminal of the switch circuit is coupled to the data latch. The second control terminal of the switch circuit receives the power detecting signal. The second terminal of the switch circuit is coupled to the random access memory, the function block and the microprocessor. During a detecting period, the power detecting signal is enabled, the first terminal of the discharge circuit is electrically connected to the second terminal of the discharge unit, and the first terminal of the switch circuit is electrically disconnected to the second terminal of the switch circuit. If a power low signal outputted from the data latch and received by the first control terminal of the switch circuit is altered from a first state to the second state during the detecting period, the circuit between the first terminal and the second terminal of the switch circuit is kept disconnecting, and the microprocessor stop the operation of the function block to reduce the power consumption and to keep the voltage of the second terminal of the switch circuit so that data loss of the random access memory is prevented.

In the power detecting circuit and the portable device according to the preferred embodiment of the present invention, the data latch includes an inverter and a first N-type transistor. The inverter is coupled to the power input terminal. A gate terminal of the first N-type transistor is coupled to an output terminal of the inverter. A first source/drain terminal of the first N-type transistor is coupled to the power input terminal. A second source/drain terminal of the first N-type transistor is coupled to the common voltage. In addition, the discharge unit includes a second N-type transistor. A gate terminal of the second N-type transistor receives the power detecting signal. A first source/drain terminal of the second N-type transistor is coupled to the power input terminal. A second source/drain terminal of the second N-type transistor is coupled to the common voltage.

In the power detecting circuit and the portable device according to the preferred embodiment of the present invention, the switch circuit includes a P-type transistor and a logical OR gate. The first source/drain terminal of the P-type transistor is coupled to the power input terminal. The second source/drain terminal of the P-type transistor is the second terminal of the switch circuit. The logical OR gate includes a first input terminal, a second input terminal and an output terminal. The output terminal of the logical OR gate is coupled to a gate terminal of the P-type transistor. The first input terminal of the logical OR gate is coupled to the output terminal of the inverter. The second input terminal of the logical OR gate receives the power detecting signal. Similarly, the switch circuit also may include a P-type transistor and a logical NAND gate in another embodiment. The first source/drain terminal of the P-type transistor is coupled to the power input terminal. The second source/drain terminal of the P-type transistor is the second terminal of the switch circuit. The logical NAND gate includes a first input terminal, a second input terminal and an output terminal. The output terminal of the logical NAND gate is coupled to the gate terminal of the P-type transistor. The first input terminal of the logical NAND gate is coupled to the input terminal of the inverter. The second input terminal of the logical NAND gate receives the power detecting signal.

The present invention further provides a method for preventing data loss adapted for a portable device. The portable device includes a random access memory, a power input terminal, a microprocessor and a function block. The method includes the steps of: setting a switch circuit between the power input terminal and a power relay terminal, wherein the power input terminal is coupled to the random access memory, the microprocessor and the function block through the power relay terminal so as to provide a power to the random access memory, the microprocessor and the function block; setting a capacitor on the power relay terminal; setting a data latch on the power input terminal; detecting a power voltage on the power input terminal at each preset time period, wherein the detecting method includes: cutting off the switch circuit; testing to discharge the power input terminal from a power voltage to a common voltage; and determining whether a state of a power low signal outputted from the data latch is changed, wherein the state of the power low signal is changed when a power supply voltage inputted from the power input terminal is charged/discharged to a common voltage; wherein, when the state of the power low signal is changed, the method further includes the steps of: maintaining to cut off the switch circuit; and shutting the function block off by the microprocessor.

The spirit of the present invention is to utilize ingenious combination logic to detect the external power supply voltage inputted from the battery. Since there is no static power consumption in the logic circuit, the power detecting circuit is no power consumption during the period from the time when the battery power is removed to the time when the power is recovered. Therefore, the contents of the register and/or the RAM can be maintained for long time by charges storing in the capacitor.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

Figure 1:
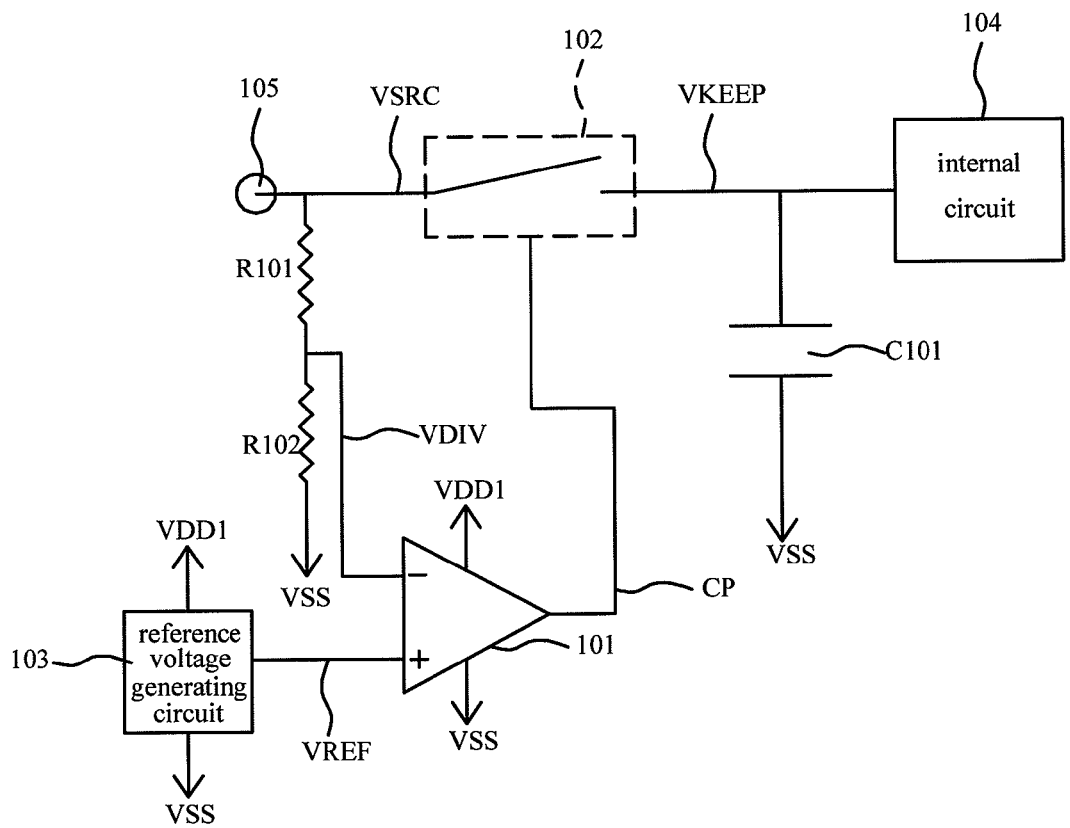
FIG. 1 is a circuit diagram depicting a low-voltage detection circuit in the prior art.
Figure 2:
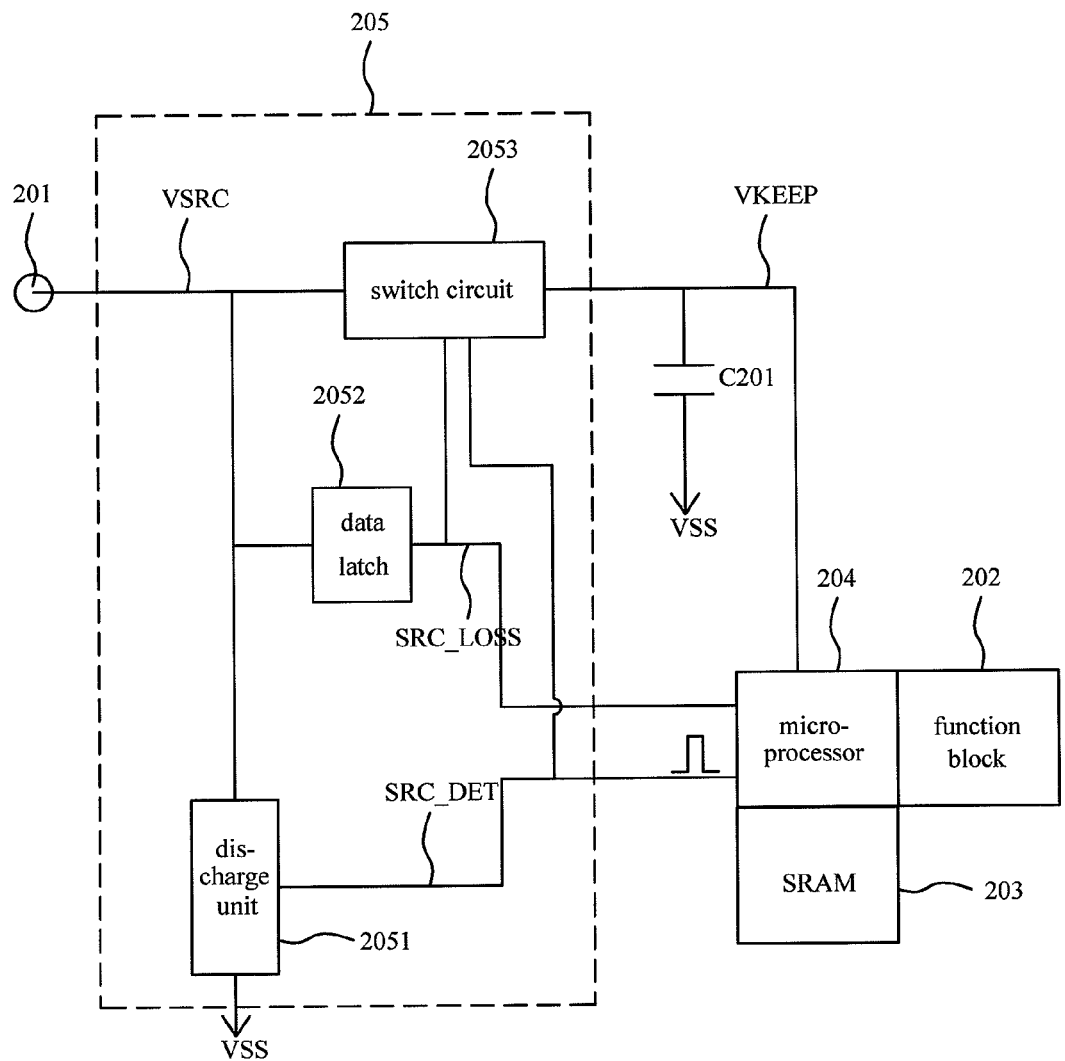
FIG. 2 is a system block diagram depicting a portable device according to a first embodiment of the present invention.

FIG. 2 is a system block diagram depicting a portable device according to a first embodiment of the present invention. Referring to FIG. 2, the portable device includes a power input terminal 201, a function block 202, a static random access memory (SRAM) 203, a microprocessor 204 and a power detecting circuit 205 of the present embodiment of the present invention. The power detecting circuit 205 includes a discharge unit 2051, a data latch 2052 and a switch circuit 2053. In order to enable one of ordinary skill in the art to implement the present invention according to the embodiment of the present invention, a capacitor C201, a power detecting signal SRC_DET, a power low signal SRC_LOSS, a battery voltage VSRC, an internal power supply voltage VKEEP and a common voltage VSS are illustrated in FIG. 2. The function block 202, the SRAM 203 and the microprocessor 204 use the internal power supply voltage VKEEP to be their power supply as well.

In normal operation mode, both the power detecting signal SRC_DET and the power low signal SRC_LOSS are disabled and the switch circuit 2053 is in short circuit state. Therefore, the internal power supply voltage VKEEP can be substantially equal to the battery voltage VSRC. When the detection starts, the microprocessor 204 sends the power detecting signal SRC_DET. Meanwhile, the switch circuit 2053 is controlled by the power detecting signal SRC_DET to be an open circuit state. Moreover, the discharge unit 2051 is also controlled to be a short circuit state by the power detecting signal SRC_DET. If the battery is connected to the power input terminal 201, the discharge unit 2051 cannot pull the battery voltage VSRC down to the common voltage VSS, and the data latch 2052 will not be operated. When the power detecting signal SRC_DET returns to the disabled state, the switch circuit 2053 is recovered to a short circuit state, and the discharge unit 2051 is cut off. Therefore, the voltage level of the internal power supply voltage VKEEP will be kept to the voltage level of the battery voltage VSRC.

If the battery does not be connected to the power input terminal 201, when the detecting starts, the microprocessor 204 would enable the power detecting signal SRC_DET, the battery voltage VSRC would be pulled down to the common voltage VSS, and then the data latch 2052 would latch the state of VSRC=VSS and enable the power low signal SRC_LOSS. Moreover, the switch circuit 2053 would be cut off by the control of the power detecting signal SRC_DET and the power low signal SRC_LOSS. When the enabled power low signal SRC_LOSS is received, the microprocessor 204 would disable the function block 202 with power consumption so that the portable device enters the standby mode. Meanwhile, the internal power supply voltage VKEEP only supplies to the microprocessor 204 and the static random access memory 203. The capacitor C201 can be used for maintaining the voltage level of the internal power supply voltage VKEEP for a long period so that the contents of the register of the microprocessor 204 and the SRAM 203 can be preserved when the battery voltage VSRC does not exist. When the battery is connected, the battery voltage VSRC rises and the output state of the data latch 2052 is changed to disable the power low signal SRC_LOSS. When the microprocessor 204 receives the disabled power low signal SRC_LOSS, the portable device returns to the normal operation.

According to the abovementioned embodiment, it can be observed that each and every element in the power detecting circuit 205 is digital logic circuit. Since the digital logic circuit has no static power consumption in ideal situation, but only dynamic power consumption, there is no extra power consumption when the data latch 2052 latches the state. In other words, when the battery voltage is removed, there is no power consumption except for an extremely small leakage in the power detecting circuit. Therefore, the contents of the SRAM 203 can be preserved for a long time. In contrary to the prior art, the comparator 101, resistors R101, R102 and the reference voltage generating circuit 103 have the static power consumption, and it may cause that there is not enough time for user to replace the battery. Therefore, the abovementioned embodiment can be used for correcting the above-mentioned drawback in the prior art.

The detailed circuit and description are provided for explanation of the present invention so that one having ordinary skill in the art can implement the present invention.

Figure 3:
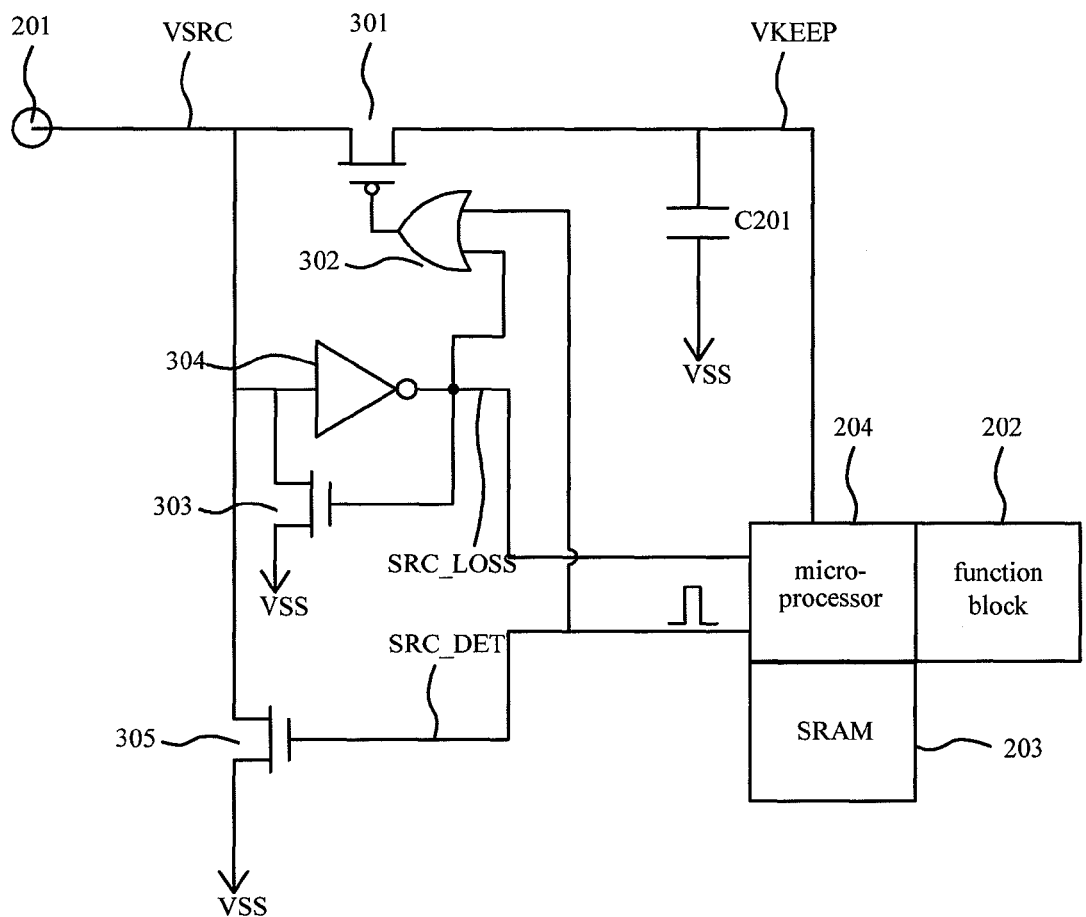
FIG. 3 is a system block diagram depicting a portable device according to a second embodiment of the present invention.

FIG. 3 is a system block diagram depicting a portable device according to a second embodiment of the present invention. Referring to FIG. 3, in this embodiment, the switch circuit 2053 is implemented by a P-type metal oxide semiconductor field-effect transistor (MOSFET) 301 and a logical OR gate 302. The data latch 2052 is implemented by a N-type MOSFET 303 and an inverter 304. The discharge unit 2051 is implemented by a N-type MOSFET 305.

Similarly, when the power detecting signal SRC_DET is enabled, that is, the power detecting signal SRC_DET is changed from the logical low voltage to the logical high voltage, the logical OR gate 302 receives the logical high voltage so that the output terminal thereof outputs a logical high voltage. The gate terminal of the P-type MOSFET 301 receives the logical high voltage, and the operation of the P-type MOSFET 301 would enter the cut-off region. Meanwhile, the N-type MOSFET 305 is turned on. If the battery is removed, the battery voltage VSRC would be pulled down to the common voltage VSS (generally, VSS is a ground voltage). When the battery voltage VSRC is pulled down to the common voltage VSS, the output terminal of the inverter 304 would outputs the logical high voltage, in other words, the power low signal SRC_LOSS is changed from the logical low voltage to the logical high voltage. When the gate terminal of the N-type MOSFET 303 receives the logical high voltage, the N-type MOSFET 303 is continuously turned on such that the voltage VSRC is latched at the ground voltage VSS. Meanwhile, the logical OR gate 302 receives the power low signal SRC_LOSS in the logical high voltage, the output terminal thereof would output the logical high voltage so that the P-type MOSFET 301 is maintained the operation in cut-off region. When the microprocessor 204 receives the power low signal SRC_LOSS in the logical high voltage, the function block 202 with the power consumption is stopped by the microprocessor 204 so that the portable device enters the standby mode. At this time, the internal power supply voltage VKEEP only supplies to the microprocessor 204 and the SRAM 203, and then the capacitor C201 can be used for maintaining the voltage level of the internal power supply voltage VKEEP so that the contents of the register of the microprocessor 204 and the SRAM 203 can be preserved when the battery voltage VSRC does not exist.

Figure 4:
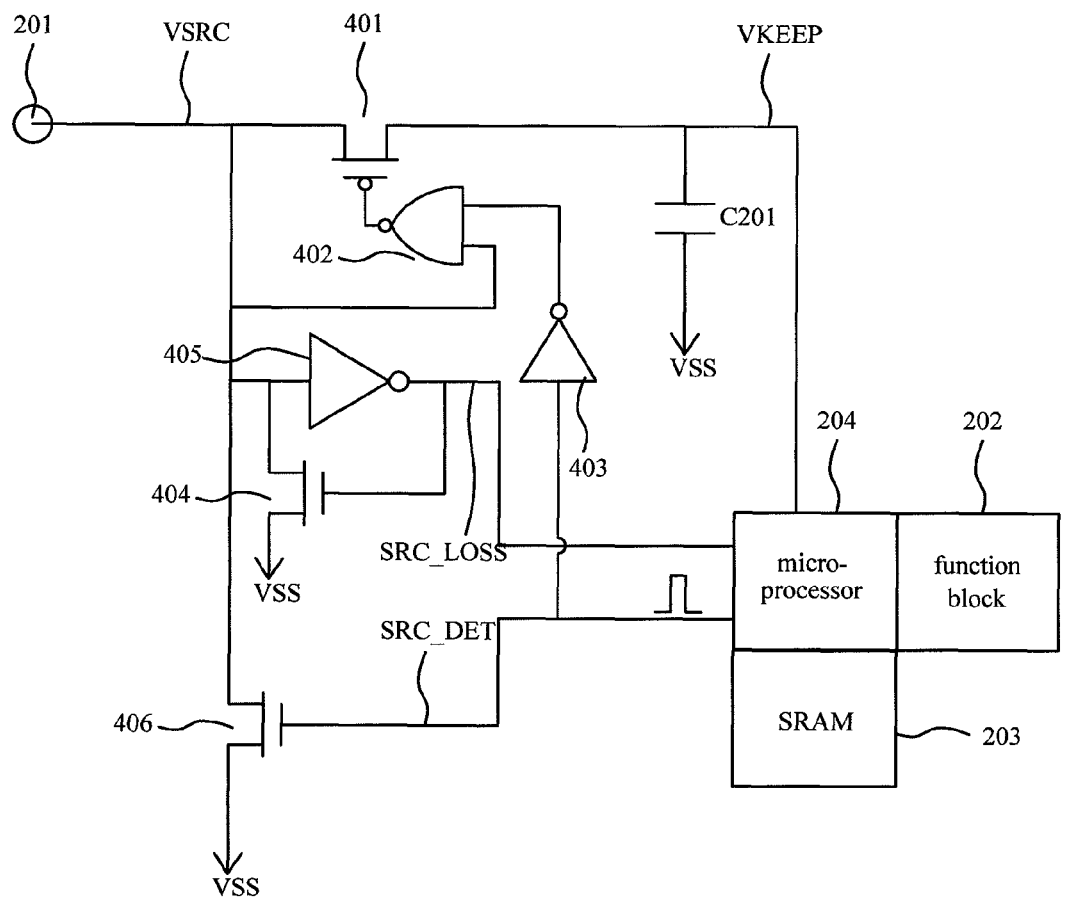
FIG. 4 is a system block diagram depicting a portable device according to a third embodiment of the present invention.

FIG. 4 is a system block diagram depicting a portable device according to a third embodiment of the present invention. Referring to FIG. 4, in this embodiment, the switch circuit 2053 is implemented by a P-type MOSFET 401, a logical NAND gate 402 and an inverter 403. The data latch 2052 is implemented by a N-type MOSFET 404 and an inverter 405. The discharge unit 2052 is implemented by a N-type MOSFET 406.

It is similar to the operation of the circuit in FIG. 3. Similarly, when the power detecting signal SRC_DET is enabled, that is, the power detecting signal SRC_DET is changed from the logical low voltage to the logical high voltage, the inverter 403 receives the logical high voltage to output the logical low voltage. When the logical NAND gate 402 receives the logical low voltage, the output terminal thereof would output the logical high voltage. When the gate terminal of the P-type MOSFET 401 receives the logical high voltage, the operation thereof would enter the cut-off region. Meanwhile, the N-type MOSFET 406 is turned on. If the battery is removed at this time, the battery voltage VSRC would be pulled down to the common voltage VSS (generally the common voltage is a ground voltage). When the battery voltage is pulled down to the common voltage VSS, the output terminal of the inverter 405 would output the logical high voltage. In other words, the power low signal SRC_LOSS is changed from the logical low voltage to the logical high voltage. When the gate terminal of the N-type MOSFET 404 receives the logical high voltage, the N-type MOSFET 404 is continuously turned on so that the voltage VSRC is latched to the ground voltage VSS.

The difference between this embodiment and the embodiment in FIG. 3 is that the other input terminal of the logical NAND gate 402 is coupled to the input terminal of the inverter 405. When the logical NAND gate 402 receives the logical low voltage inputted to the input terminal of the inverter 405, the output terminal thereof would output the logical high voltage so that the P-type MOSFET 401 is maintained to operate in the cut-off region. When the microprocessor 204 receives the power low signal SRC_LOSS in the logical high voltage, the operation of the function block 202 with the power consumption in the portable device is stopped so that the portable device enters the standby mode. Meanwhile, the internal power supply voltage VKEEP is only used for supplying to the microprocessor 204 and the SRAM 203 so that the voltage VKEEP of the capacitor C201 can be kept for a long time. Even when the battery voltage VSRC does not exist, the contents of the register of the microprocessor 204 and the SRAM 203 can be preserved.

According to the abovementioned embodiment, the circuits of the data latch 2052, discharge unit 2051 and the switch circuit 2053 can be changed according to different digital logic designs. For example, if the power detecting signal SRC_DET is normally in a logical high voltage, and the power detecting signal SRC_DET is in a logical low voltage when detection is performed, the discharge unit 2051 can be designed to be a N-type MOSFET and an inverter, wherein the input terminal of the inverter receives the power detecting signal SRC_DET and the output terminal of the inverter is coupled to the gate terminal of the N-type MOSFET. Similarly, the inverter 403 of the switch circuit 2053 in FIG. 4 can be removed. Therefore, the spirit of the invention should not be limited under the logic design in the abovementioned embodiment.

Figure 5:
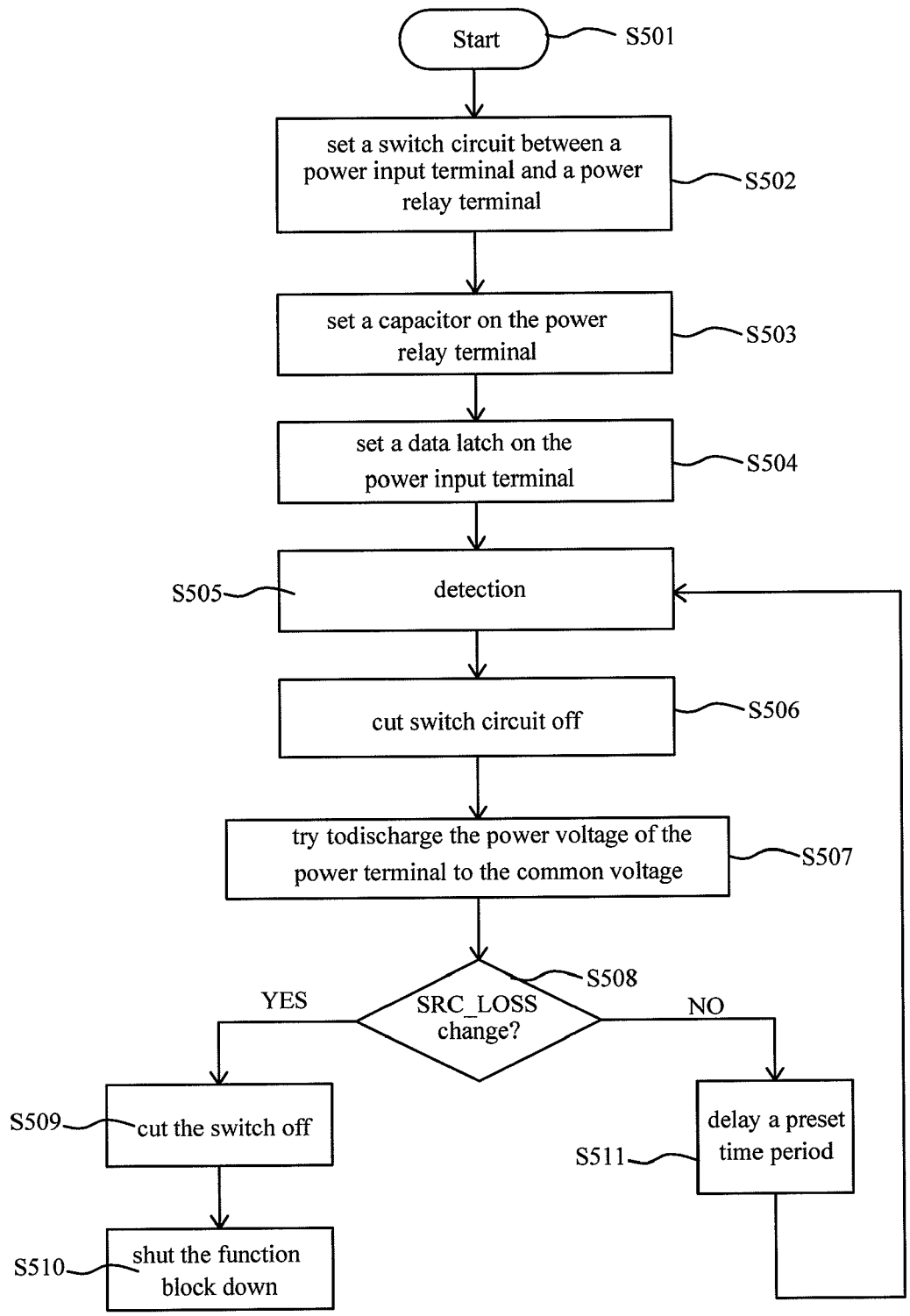
FIG. 5 is a flow chart depicting a method for preventing data loss according to a preferred embodiment of the present invention.

Moreover, according to the abovementioned embodiments, the method for preventing data loss can be generalized. FIG. 5 is a flow chart depicting a method for preventing data loss according to a preferred embodiment of the present invention. Referring to FIG. 5, the method includes the steps as follows.

In step S501, the method starts.

In step S502, a switch circuit is set between the power input terminal and a power relay terminal, wherein the power input terminal is coupled to the SRAM, the microprocessor and the function block through the power relay terminal so as to provide that a power voltage to the SRAM, the microprocessor and the function block.

In step S503, a capacitor is set on the power relay terminal.

In step S504, a data latch is set on the power input terminal.

The abovementioned steps are illustrated in abovementioned embodiments, such as FIG. 2 to FIG. 4, so that the detailed description is omitted.

In step S505, the detection starts.

In step S506, the switch circuit is cut off.

In step S507, a power voltage of the power input terminal is tested to charge/discharge to a common voltage.

In step S508, it is determined whether or not a power low signal SRC_LOSS outputted from the data latch is change. Generally Speaking, the power low signal SRC_LOSS outputted from the data latch would be changed according to the state of the power voltage of the power input terminal. When the power voltage of the power input terminal is charged/discharged to the common voltage, the power low signal SRC_LOSS outputted from the data latch may be changed from the logical high voltage to the logical low voltage or from the original logical low voltage to the logical high voltage. Since the mention above is design of selectiveness, the detailed description is omitted. When the determination is positive, the step S509 is performed. When the determination is negative, the step S511 is performed to re-detect.

In step S509, the switch circuit is continuously cut off when the power low signal SRC_LOSS outputted from the data latch is changed.

In step S510, the function block is shut down by the microprocessor.

In step S511, it waits a preset time and enter the step S505.

To sum up, the spirit of the present invention is to utilize ingenious combination logic to detect the external power supply voltage inputted from the battery. Since there is no static power consumption in the logic circuit, the power detecting circuit is no power consumption during the period from the time when the battery power is removed to the time when the power is recovered. Therefore, the contents of the register and/or the RAM can be maintained for long time by charges storing in the capacitor.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. A power detecting circuit adapted for a portable device, wherein the portable device includes a power input terminal, the power detecting circuit comprising:
   a data latch, coupled to the power input terminal, for receiving a voltage inputted from the power input terminal;
   a discharge unit, comprising a first terminal, a second terminal and a control terminal, wherein the first terminal of the discharge unit is coupled to the power input terminal, the second terminal of the discharge unit is coupled to a common voltage, the control terminal of the discharge unit receives a power detecting signal, wherein the first terminal and the second terminal of the discharge unit are electrically connected when the power detecting signal is enabled; and a switch circuit, comprising a first terminal, a second terminal, a first control terminal and a second control terminal, wherein the first terminal of the switch circuit is coupled to the power input terminal, the first control terminal of the switch circuit is coupled to the data latch, the second control terminal receives the power detecting signal, wherein, during a detecting period, the power detecting signal is enabled, the first terminal and the second terminal of the switch circuit are disconnected, if a power low signal outputted from the data latch and received from the first control terminal of the switch circuit is altered from a first state to a second state during the detecting period, the circuit between the first terminal and the second terminal of the switch circuit is kept disconnecting.

2. The power detecting circuit according to claim 1, wherein the data latch comprises:
a first inverter, comprising an input terminal and an output terminal, wherein the input terminal of the first inverter is coupled to the power input terminal; and
a first N-type transistor, comprising a gate terminal, a first source/drain terminal and a second source/drain terminal, wherein the gate terminal of the first N-type transistor is coupled to the output terminal of the first inverter, the first source/drain terminal of the first N-type transistor is coupled to the power input terminal, the second source/drain terminal of the first N-type transistor is coupled to the common voltage.

3. The power detecting circuit according to claim 2, wherein the switch circuit comprises:
a P-type transistor, comprising a gate terminal, a first source/drain terminal and a second source/drain terminal, wherein the first source/drain terminal of the P-type transistor is coupled to the power input terminal, the second source/drain terminal of the P-type transistor is the second terminal of the switch circuit; and
a logical OR gate, comprising a first input terminal, a second input terminal and an output terminal, wherein the output terminal of the logical OR gate is coupled to the gate terminal of the P-type transistor, the first input terminal of the logical OR gate is coupled to the output terminal of the first inverter, the second input terminal of the logical OR gate receives the power detecting signal.

4. The power detecting circuit according to claim 2, wherein the switch circuit comprises:
a second inverter, comprising an input terminal and an output terminal, wherein the input terminal of the second inverter receives the power detecting signal;
a P-type transistor, comprising a gate terminal, a first source/drain terminal and a second source/drain terminal, wherein the first source/drain terminal of the P-type transistor is coupled to the power input terminal, the second source/drain terminal of the P-type transistor is the second terminal of the switch circuit; and
a logical NAND gate, comprising a first input terminal, a second input terminal and an output terminal, wherein the output terminal of the logical NAND gate is coupled to the gate terminal of the P-type transistor, the first input terminal of the logical NAND gate is coupled to the input terminal of the first inverter, the second input terminal of the logical NAND gate is coupled to the output terminal of the second inverter.

5. The power detecting circuit according to claim 1, wherein the discharge unit comprises:
a second N-type transistor, comprising a gate terminal, a first source/drain terminal and a second source/drain terminal, wherein the gate terminal of the second N-type transistor receives the power detecting signal, the first source/drain terminal of the second N-type transistor is coupled to the power input terminal, the second source/drain terminal of the second N-type transistor is coupled to the common voltage.

6. A portable device, comprising:
a power input terminal;
a function block;
a random access memory;
a microprocessor, coupled to the random access memory and the function block, for controlling the operations of the random access memory and the function block; and
a power detecting circuit, comprising:
a data latch, coupled to the power input terminal, for receiving a voltage inputted from the power input terminal;
a discharge unit, comprising a first terminal, a second terminal and a control terminal, wherein the first terminal of the discharge unit is coupled to the power input terminal, the second terminal of the discharge unit is coupled to a common voltage, the control terminal of the discharge unit receives a power detecting signal, wherein the first terminal and the second terminal of the discharge unit are electrically connected when the power detecting signal is enabled; and
a switch circuit, comprising a first terminal, a second terminal, a first control terminal and a second control terminal, wherein the first terminal of the switch circuit is coupled to the power input terminal, the first control terminal of the switch circuit is coupled to the data latch, the second control terminal receives the power detecting signal,
wherein, during a detecting period, the power detecting signal is enabled, the first terminal and the second terminal of the switch circuit are disconnected, if a power low signal outputted from the data latch and received from the first control terminal of the switch circuit is altered from a first state to a second state during the detecting period, the circuit between the first terminal and the second terminal of the switch circuit is kept disconnecting, and the microprocessor stops the operation of the function block so as to prevent data loss of the random access memory.

7. The portable device according to claim 6, wherein the data latch comprises:
a first inverter, comprising an input terminal and an output terminal, wherein the input terminal of the first inverter is coupled to the power input terminal; and
a first N-type transistor, comprising a gate terminal, a first source/drain terminal and a second source/drain terminal, wherein the gate terminal of the first N-type transistor is coupled to the output terminal of the first inverter, the first source/drain terminal of the first N-type transistor is coupled to the power input terminal, the second source/drain terminal of the first N-type transistor is coupled to the common voltage.

8. The portable device according to claim 7, wherein the switch circuit comprises:
a P-type transistor, comprising a gate terminal, a first source/drain terminal and a second source/drain terminal, wherein the first source/drain terminal of the P-type transistor is coupled to the power input terminal, the second source/drain terminal of the P-type transistor is the second terminal of the switch circuit; and a logical OR gate, comprising a first input terminal, a second input terminal and an output terminal, wherein the output terminal of the logical OR gate is coupled to the gate terminal of the P-type transistor, the first input terminal of the logical OR gate is coupled to the output terminal of the first inverter, the second input terminal of the logical OR gate receives the power detecting signal.

9. The portable device according to claim 7, wherein the switch circuit comprises:

a second inverter, comprising an input terminal and an output terminal, wherein the input terminal of the second inverter receives the power detecting signal;

a P-type transistor, comprising a gate terminal, a first source/drain terminal and a second source/drain terminal, wherein the first source/drain terminal of the P-type transistor is coupled to the power input terminal, the second source/drain terminal of the P-type transistor is the second terminal of the switch circuit; and a logical NAND gate, comprising a first input terminal, a second input terminal and an output terminal, wherein the output terminal of the logical NAND gate is coupled to the gate terminal of the P-type transistor, the first input terminal of the logical NAND gate is coupled to the input terminal of the first inverter, the second input terminal of the logical NAND gate is coupled to the output terminal of the second inverter.

10. The portable device according to claim 6, wherein the discharge unit comprises:

a second N-type transistor, comprising a gate terminal, a first source/drain terminal and a second source/drain terminal, wherein the gate terminal of the second N-type transistor receives the power detecting signal, the first source/drain terminal of the second N-type transistor is coupled to the power input terminal, the second source/drain terminal of the second N-type transistor is coupled to the common voltage.

11. A method for preventing data loss, adapted for a portable device, wherein the portable device comprises a random access memory, a power input terminal, a microprocessor and a function block, the method comprising:

setting a switch circuit between the power input terminal and a power relay terminal, wherein the power input terminal is coupled to the random access memory, the microprocessor and the function block through the power relay terminal so as to provide a power to the random access memory, the microprocessor and the function block;

setting a capacitor on the power relay terminal;

setting a data latch on the power input terminal;

detecting a power voltage on the power input terminal at each preset time period, wherein the detecting method comprise:

cutting off the switch circuit;

testing to discharge the power input terminal from a power voltage to a common voltage; and determining whether a state of a power low signal outputted from the data latch is changed, wherein the state of the power low signal is changed when a power supply voltage inputted from the power input terminal is charged/discharged to a common voltage;

wherein, when the state of the power low signal is changed:
maintaining to cut off the switch circuit; and
shutting the function block off by the microprocessor.

12. The method for preventing data loss, adapted for a portable device according to claim 11, wherein the data latch comprises a first inverter and a first N-type transistor, wherein a input terminal of the first inverter is coupled to the power input terminal, a gate terminal of the first N-type transistor is coupled to an output terminal of the first inverter, a first source/drain terminal of the first N-type transistor is coupled to the power input terminal, a second source/drain terminal of the first N-type transistor is coupled to the common voltage, wherein the switch circuit comprises a P-type transistor and a logical OR gate, wherein a first source/drain terminal of the P-type transistor is coupled to the power input terminal, a second source/drain terminal of the P-type transistor is coupled to the power relay terminal, an output terminal of the logical OR gate is coupled to a gate terminal of the P-type transistor, a first input terminal of the logical OR gate is coupled to the output terminal of the first inverter, a second input terminal of the logical OR gate receives the power detecting signal, wherein the method further comprises:

detecting a power supply voltage of the power input terminal when the power detecting signal is logic high voltage; and maintaining to cut off the switch circuit and shutting the function block off by the microprocessor when the state of the power low signal outputted from the output terminal of the first inverter is changed to a logic high voltage.

13. The method for preventing data loss, adapted for a portable device according to claim 11, wherein the data latch comprises a first inverter and a first N-type transistor, wherein a input terminal of the first inverter is coupled to the power input terminal, a gate terminal of the first N-type transistor is coupled to an output terminal of the first inverter, a first source/drain terminal of the first N-type transistor is coupled to the power input terminal, a second source/drain terminal of the first N-type transistor is coupled to the common voltage, wherein the switch circuit comprises a second inverter, a P-type transistor and a logical NAND gate, wherein an input terminal of the second inverter receives the power detecting signal, a first source/drain terminal of the P-type transistor is coupled to the power input terminal, a second source/drain terminal of the P-type transistor is coupled to the power relay terminal, an output terminal of the logical NAND gate is coupled to a gate terminal of the P-type transistor, a first input terminal of the logical NAND gate is coupled to the input terminal of the first inverter, a second input terminal of the logical NAND gate is coupled to an output terminal of the second inverter, wherein the method further comprises:

detecting a power supply voltage of the power input terminal when the power detecting signal is logic high voltage; and maintaining to cut off the switch circuit and shutting the function block off by the microprocessor when the state of the power low signal outputted from the output terminal of the first inverter is changed to a logic high voltage.

* * * * *